US011283403B1

United States Patent
Hsieh et al.

(10) Patent No.: US 11,283,403 B1
(45) Date of Patent: Mar. 22, 2022

(54) TEMPERATURE-CONTROLLED AND TEMPERATURE-COMPENSATED OSCILLATING DEVICE AND METHOD THEREOF

(71) Applicant: TXC CORPORATION, Taipei (TW)

(72) Inventors: Wan-Lin Hsieh, Ping Cheng (TW); Sheng-Hsiang Kao, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/132,739

(22) Filed: Dec. 23, 2020

(51) Int. Cl.
*H03B 5/04* (2006.01)
*H03K 5/24* (2006.01)
*H03B 5/36* (2006.01)

(52) U.S. Cl.
CPC ............... *H03B 5/04* (2013.01); *H03B 5/36* (2013.01); *H03K 5/24* (2013.01); *H03B 2200/004* (2013.01)

(58) Field of Classification Search
CPC ........................................................ H03B 5/04
USPC ................................................. 331/70, 176
See application file for complete search history.

(56) References Cited

U.S. PATENT DOCUMENTS

| 7,573,345 | B2 | 8/2009 | Hardy et al. | |
| 7,982,550 | B1* | 7/2011 | Quevy | H03L 7/16 331/176 |
| 2002/0180544 | A1* | 12/2002 | Fukayama | H03B 5/04 331/176 |
| 2012/0013410 | A1* | 1/2012 | Rebel | H03L 1/022 331/70 |
| 2013/0314169 | A1* | 11/2013 | Tokuhashi | H03L 1/04 331/176 |

* cited by examiner

*Primary Examiner* — Joseph Chang
(74) *Attorney, Agent, or Firm* — Birch, Stewart, Kolasch & Birch, LLP

(57) ABSTRACT

A temperature-controlled and temperature-compensated oscillating device and a method of temperature control and temperature compensation is disclosed. The operating temperature of a frequency source is adjusted by driving a heater to a target temperature when the ambient temperature is in a first range between a first temperature and a second temperature higher than the third temperature. The frequency variation of the frequency source resulted from a variation of the ambient temperature is reduced by applying a voltage to the frequency source when the ambient temperature is in a second range between a third temperature and a fourth temperature higher than the third temperature. The third temperature is higher than the first temperature.

11 Claims, 8 Drawing Sheets

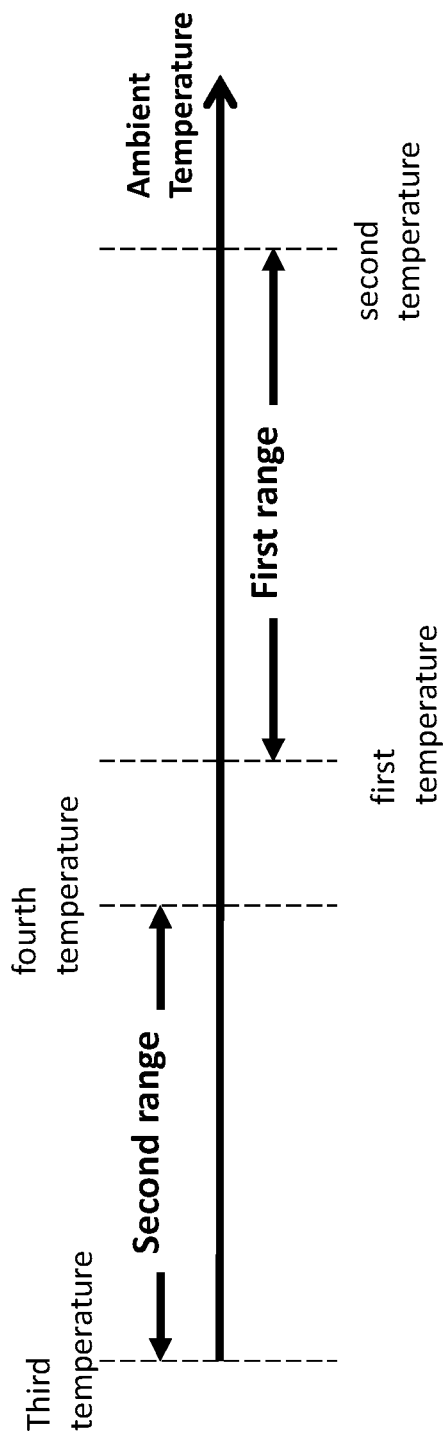
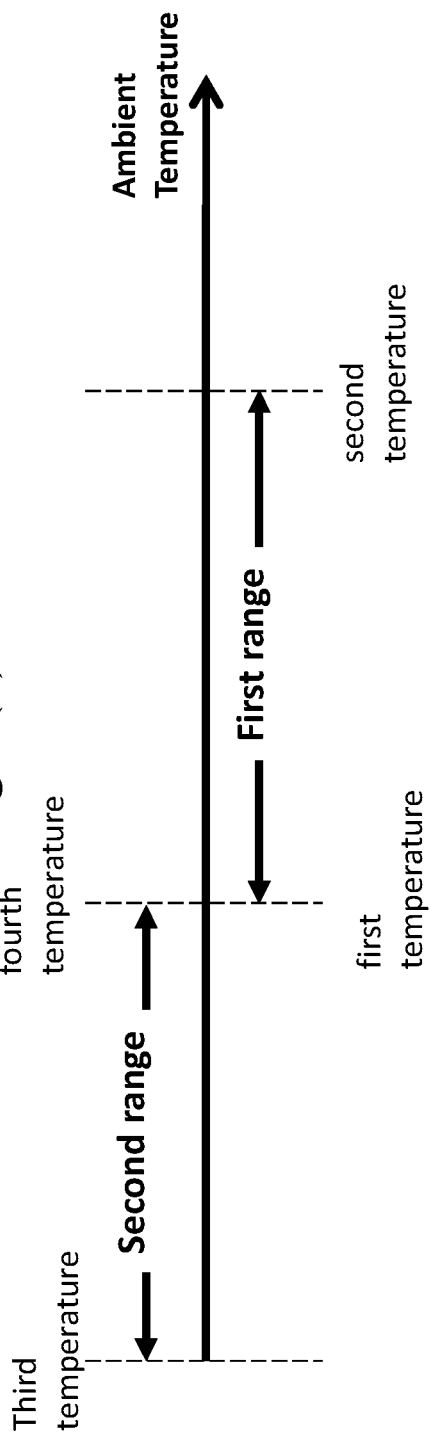

TEMPERATURE-CONTROLLED AND TEMPERATURE-COMPENSATED OSCILLATING DEVICE AND METHOD THEREOF

BACKGROUND OF THE INVENTION

Field of the Invention

The present invention relates to a temperature-controlled and temperature-compensated oscillating device and a related method.

Description of the Related Art

A quartz resonator applied to a crystal oscillator has the property of varying greatly in oscillation frequency characteristics in response to a temperature. Various technologies have been proposed in order to compensate for such variations to ensure highly accurate stable frequency characteristics. A conventionally known oven controlled crystal oscillator is one of such technologies.

This type of the oven controlled crystal oscillator is configured to compare an actual temperature, which is related to an outside air temperature measured with a temperature sensor, with a set temperature, and control a heat source so that a difference between both temperatures is narrowed, thereby keeping the temperature of a quartz resonator housed in a thermostatic oven as a casing at a predetermined target temperature. In detail, the oven controlled crystal oscillator is usually constituted by integrating the temperature sensor; a temperature setting unit where the predetermined target temperature has been set; a comparator; or a control means such as a transistor; a heater as the heat source; and so on with an oscillation circuit for driving the quartz resonator for modularization, and housing the resulting module within the thermostatic oven together with the quartz resonator. The temperature sensor, the temperature setting unit, the comparator, and the heater are integrated in an integrated circuit (IC). When the actual temperature is lower, the set temperature is higher. However, too high a set temperature will degrade the performance of the IC.

To overcome the abovementioned problems, the present invention provides a temperature-controlled and temperature-compensated oscillating device and a method of temperature control and temperature compensation, so as to solve the afore-mentioned problems of the prior art.

SUMMARY OF THE INVENTION

The present invention provides a temperature-controlled and temperature-compensated oscillating device and a method of temperature control and temperature compensation, lest too high a target temperature degrade the performance of an integrated circuit (IC).

In an embodiment of the present invention, an oscillating device is arranged in an environment having an ambient temperature. The oscillating device includes a heater, a frequency source, a voltage controlled oscillation circuit, and a temperature controlled circuit. The frequency of the frequency source is temperature-dependent on the ambient temperature. The voltage controlled oscillation circuit is coupled to the frequency source. When the ambient temperature is in a first range between a first temperature and a second temperature higher than the first temperature, the voltage controlled oscillation circuit drives the frequency source to reduce a frequency variation of the frequency source resulted from a variation of the ambient temperature. The temperature controlled circuit is coupled to the heater and the voltage controlled oscillation circuit. When the ambient temperature is in a second range between a third temperature and a fourth temperature higher than the third temperature, the temperature controlled circuit drives the heater to a target temperature to adjust an operating temperature of the frequency source. The first temperature is higher than the third temperature.

In an embodiment of the present invention, an oscillating device is arranged in an environment having an ambient temperature. The oscillating device includes a heater, a temperature controlled circuit, a frequency source, a first temperature sensor, and a voltage controlled oscillation circuit. The temperature controlled circuit is coupled to the heater. The frequency of the frequency source is temperature-dependent on the ambient temperature. When the ambient temperature is in a first range between a first temperature and a second temperature higher than the first temperature, the temperature controlled circuit drives the heater to a target temperature to adjust an operating temperature of the frequency source. The first temperature sensor is configured to sense the ambient temperature. The first temperature sensor generates a first detected voltage based on the ambient temperature when the ambient temperature is in a second range between a third temperature and a fourth temperature higher than the third temperature. The voltage controlled oscillation circuit is coupled to the frequency source and the first temperature sensor. The voltage controlled oscillation circuit receive the first detected voltage to drive the frequency source and reduce a frequency variation of the frequency source resulted from a variation of the ambient temperature. The third temperature is higher than the first temperature.

In an embodiment of the present invention, a method of temperature control and temperature compensation for a frequency source whose frequency is temperature-dependent on an ambient temperature. The method includes: adjusting an operating temperature of the frequency source by driving a heater to a target temperature when the ambient temperature is in a first range between a first temperature and a second temperature higher than the first temperature; and reducing a frequency variation of the frequency source resulted from a variation of the ambient temperature by applying a voltage to the frequency source when the ambient temperature is in a second range between a third temperature and a fourth temperature higher than the third temperature; wherein the third temperature is higher than the first temperature.

BRIEF DESCRIPTION OF THE DRAWINGS

FIGS. 4(a)-4(d) are diagrams schematically illustrating the distribution of a first temperature, a second temperature, a third temperature, and a fourth temperature according to the first embodiment, the second embodiment, and the third embodiment of the present invention;

DETAILED DESCRIPTION OF THE INVENTION

Figure 1:
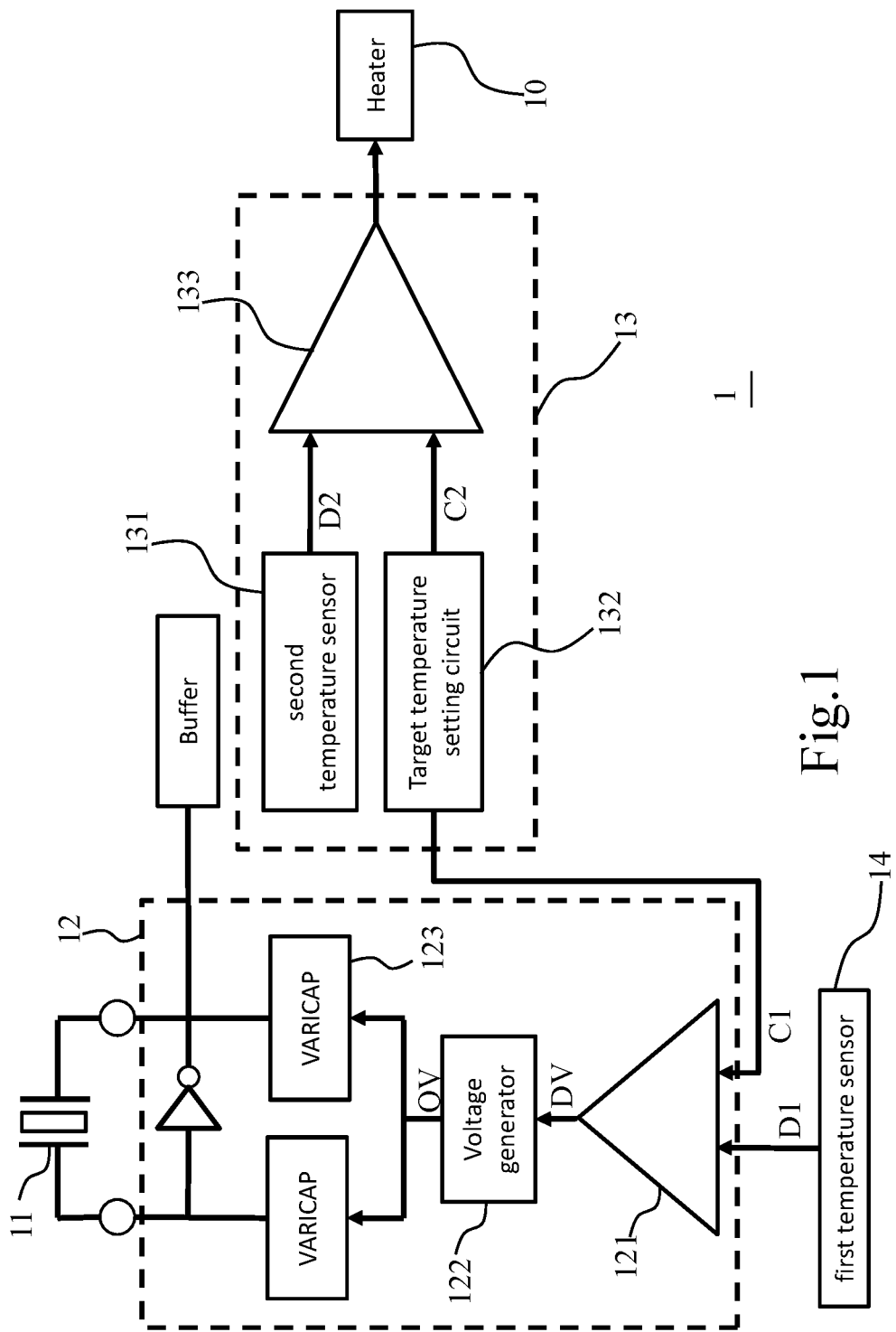
FIG. 1 is a diagram schematically illustrating an oscillating device according to a first embodiment of the invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In the following description, a temperature-controlled and temperature-compensated oscillating device and a method of temperature control and temperature compensation will be provided. In an oscillating device, a voltage controlled oscillation circuit drives a frequency source to reduce a frequency variation of the frequency source resulted from a variation of the ambient temperature when the ambient temperature is higher, lest too high a target temperature degrade the performance of an integrated circuit (IC). The oscillating devices provided below may also be applied to other circuit configurations.

FIG. 1 is a diagram schematically illustrating an oscillating device according to a first embodiment of the invention.

Referring to FIG. 1, an oscillating device 1 is arranged in an environment having an ambient temperature. The oscillating device 1 includes a heater 10, a frequency source 11, a voltage controlled oscillation circuit 12, and a temperature controlled circuit 13. Each of the voltage controlled oscillation circuit 12 and the temperature controlled circuit 13 may be an IC. The frequency of the frequency source 11 is temperature-dependent on the ambient temperature. The voltage controlled oscillation circuit 12 is coupled to the frequency source 11. When the ambient temperature is in a first range between a first temperature and a second temperature higher than the first temperature, the voltage controlled oscillation circuit 12 drives the frequency source 11 to reduce the frequency variation of the frequency source 11 resulted from the variation of the ambient temperature. The temperature controlled circuit 13 is coupled to the heater 10 and the voltage controlled oscillation circuit 12. When the ambient temperature is in a second range between a third temperature and a fourth temperature higher than the third temperature, the temperature controlled circuit 13 drives the heater 10 to a target temperature to adjust the operating temperature of the frequency source 11. The temperature controlled circuit 13 can transmit temperature information to the voltage controlled oscillation circuit 12. The first temperature is higher than the third temperature. The target temperature has a correlation of a first-order polynomial, a high-order polynomial, or a set of a first-order and high-order polynomial combination to the ambient temperature.

In some embodiments of the present invention, the oscillating device 1 may further include a first temperature sensor 14 coupled to the voltage controlled oscillation circuit 12. The first temperature sensor 14 is configured to sense the ambient temperature to generate a first detected voltage D1 when the ambient temperature is in the first range. The temperature controlled circuit 13 generates a first control voltage C1 based on the ambient temperature and the target temperature when the ambient temperature is in the first range. The voltage controlled oscillation circuit 12 receives the first control voltage C1 and the first detected voltage D1 and drives the frequency source 11 based on the first control voltage C1 and the first detected voltage D1.

In some embodiments of the present invention, the temperature controlled circuit 13 may include a second temperature sensor 131, a target temperature setting circuit 132, and a heating comparator 133. The second temperature sensor 131 is configured to sense the ambient temperature. The second temperature sensor 131 generates a second detected voltage D2 based on the ambient temperature when the ambient temperature is in the second range. The target temperature setting circuit 132 is configured to sense the ambient temperature. The target temperature setting circuit 132 generates a second control voltage C2 based on the ambient temperature and the target temperature when the ambient temperature is in the second range. The target temperature setting circuit 132 generates the first control voltage C1 based on the ambient temperature and the target temperature when the ambient temperature is in the first range. The heating comparator 133 is coupled to the heater 10, the second temperature sensor 131, and the target temperature setting circuit 132 and configured to receive the second detected voltage D2 and the second control voltage C2 and drive the heater 10 to the target temperature based on the second detected voltage D2 and the second control voltage C2.

In some embodiments of the present invention, the voltage controlled oscillation circuit 12 may include a driving comparator 121, a voltage generator 122, and at least one voltage controlled variable capacitor 123. The driving comparator 121 is coupled to the first temperature sensor 14 and the target temperature setting circuit 132. The driving comparator 121 receives the first control voltage C1 and the first detected voltage D1 to generate a driving voltage DV. The voltage generator 122 is coupled to the driving comparator 121 and configured to receive the driving voltage DV and generate at least one operating voltage OV based on the driving voltage DV. The voltage controlled variable capacitor 123 is coupled to the frequency source 11 and the voltage generator 122 and configured to receive the operating voltage OV to adjust capacitance, thereby reducing the frequency variation of the frequency source 11.

Figure 2:
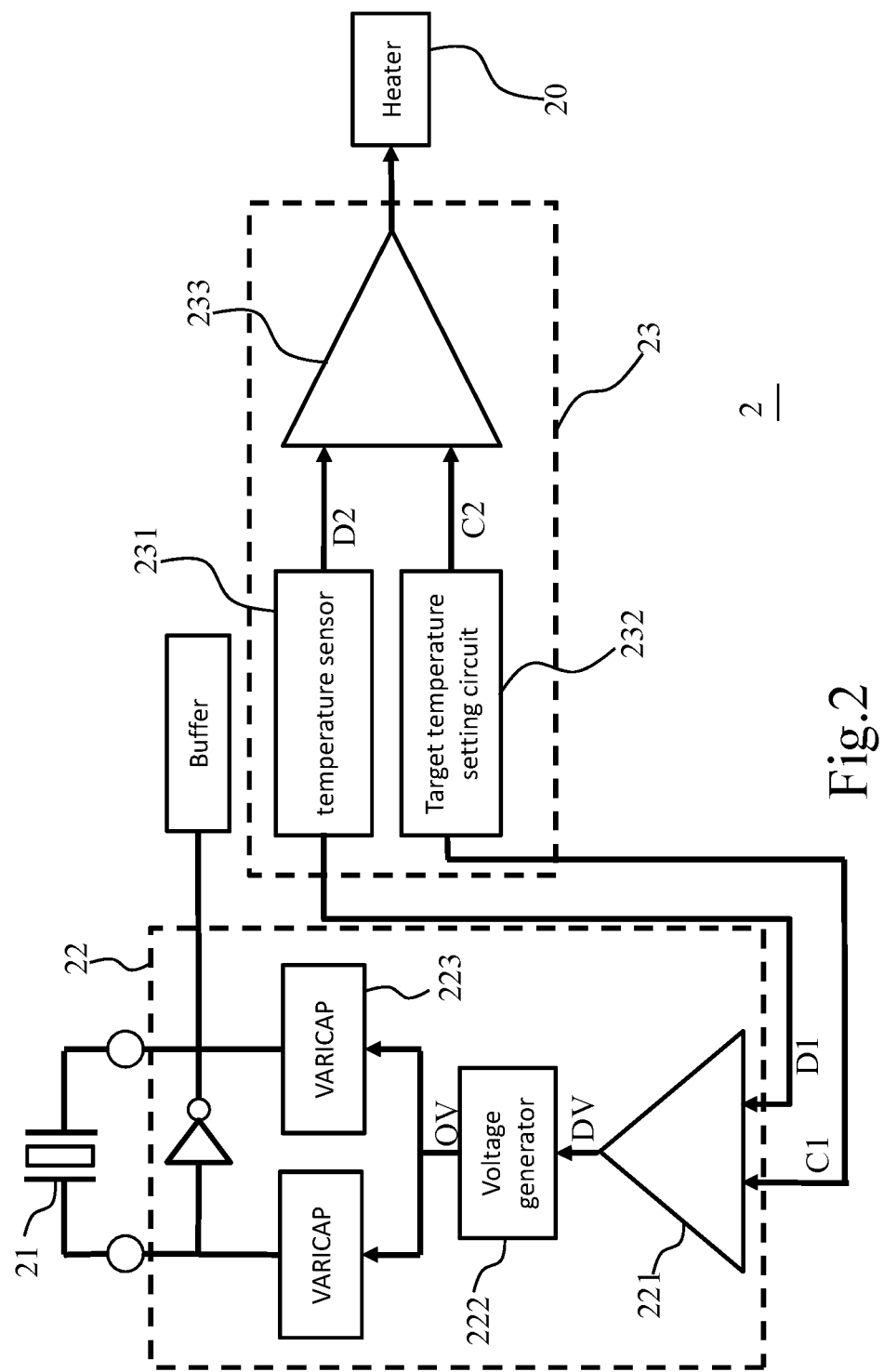
FIG. 2 is a diagram schematically illustrating an oscillating device according to a second embodiment of the invention.

FIG. 2 is a diagram schematically illustrating an oscillating device according to a second embodiment of the invention. Referring to FIG. 2, an oscillating device 2 is arranged in an environment having an ambient temperature. The oscillating device 2 includes a heater 20, a frequency source 21, a voltage controlled oscillation circuit 22, and a temperature controlled circuit 23. Each of the voltage controlled oscillation circuit 22 and the temperature controlled circuit 23 may be an IC. The frequency of the frequency source 21 is temperature-dependent on the ambient temperature. The voltage controlled oscillation circuit 22 is coupled to the frequency source 21. When the ambient temperature is in a first range between a first temperature and a second temperature higher than the first temperature, the voltage controlled oscillation circuit 22 drives the frequency source 21 to reduce the frequency variation of the frequency source 21 resulted from the variation of the ambient temperature. The temperature controlled circuit 23 is coupled to the heater 20 and the voltage controlled oscillation circuit 22. When the ambient temperature is in a second range between a third temperature and a fourth temperature higher than the third temperature, the temperature controlled circuit 23 drives the heater 20 to a target temperature to adjust the operating temperature of the frequency source 21. The temperature controlled circuit 23 can transmit temperature information to the voltage controlled oscillation circuit 22. The first temperature is higher than the third temperature. The temperature controlled circuit 23 may be configured to sense the ambient temperature to generate a first detected voltage D1 when the ambient temperature is in the first range. The temperature controlled circuit 23 may generate a first control voltage C1 based on the ambient temperature and the target temperature when the ambient temperature is in the first range. The voltage controlled oscillation circuit 22 may receive the first control voltage C1 and the first detected voltage D1 and drives the frequency source 11 based on the first control voltage C1 and the first detected voltage D1. The target temperature has a correlation of a first-order polynomial, a high-order polynomial, or a set of a first-order and high-order polynomial combination to the ambient temperature.

In some embodiments of the present invention, the temperature controlled circuit 23 may include a temperature sensor 231, a target temperature setting circuit 232, and a heating comparator 233. The temperature sensor 231 is configured to sense the ambient temperature. The temperature sensor 231 generates the first detected voltage D1 based on the ambient temperature when the ambient temperature is in the first range. The temperature sensor generates a second detected voltage D2 based on the ambient temperature when the ambient temperature is in the second range. The target temperature setting circuit 232 is configured to sense the ambient temperature. The target temperature setting circuit 232 generates the first control voltage C1 based on the ambient temperature and the target temperature when the ambient temperature is in the first range. The target temperature setting circuit 232 generates a second control voltage C2 based on the ambient temperature and the target temperature when the ambient temperature is in the second range. The heating comparator 233 is coupled to the heater 20, the temperature sensor 231, and the target temperature setting circuit 232 and configured to receive the second detected voltage D2 and the second control voltage C2 and drive the heater 20 to the target temperature based on the second detected voltage D2 and the second control voltage C2.

In some embodiments of the present invention, the voltage controlled oscillation circuit 22 may include a driving comparator 221, a voltage generator 222, and at least one voltage controlled variable capacitor 223. The driving comparator 221 is coupled to the temperature sensor 231 and the target temperature setting circuit 232 and configured to receive the first control voltage C1 and the first detected voltage D1 to generate a driving voltage DV. The voltage generator 222 is coupled to the driving comparator 221 and configured to receive the driving voltage DV and generate at least one operating voltage OV based on the driving voltage DV. The voltage controlled variable capacitor 223 is coupled to the frequency source 21 and the voltage generator 222 and configured to receive the operating voltage OV to adjust capacitance, thereby reducing the frequency variation of the frequency source 21.

Figure 3:
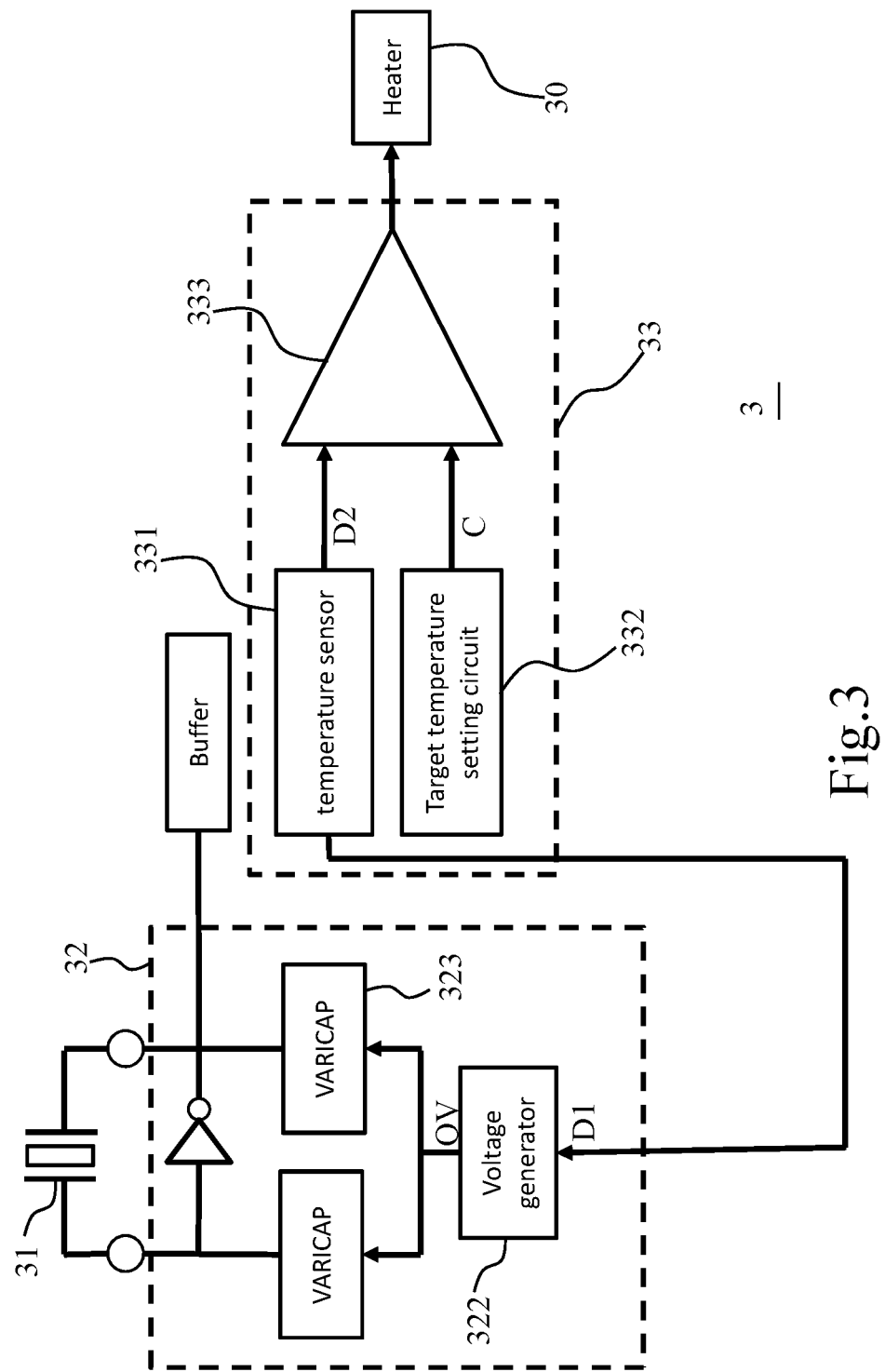
FIG. 3 is a diagram schematically illustrating an oscillating device according to a third embodiment of the invention.
Figure 4C:
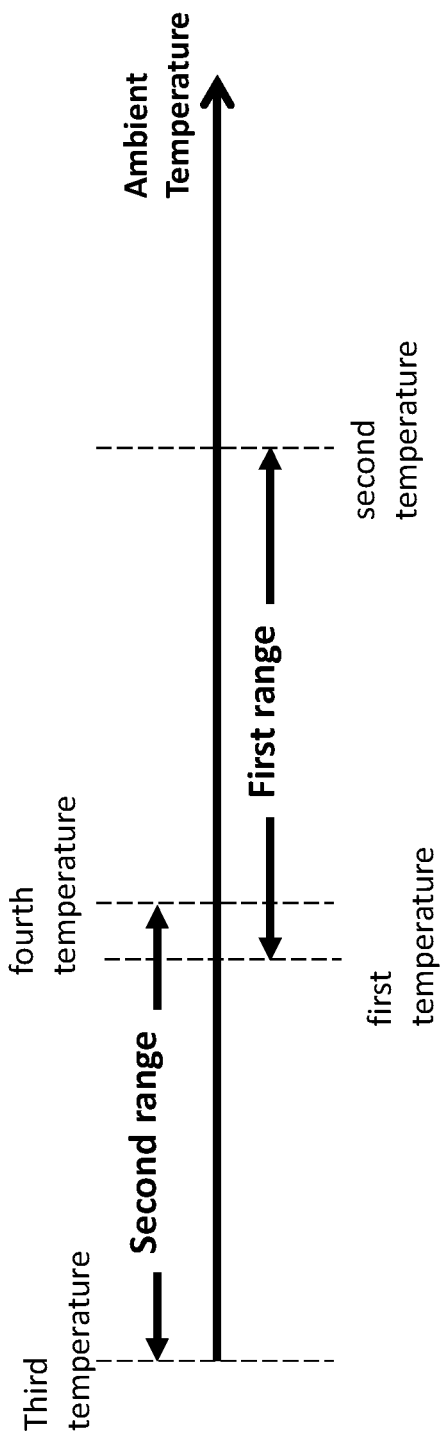
Figure 4D:
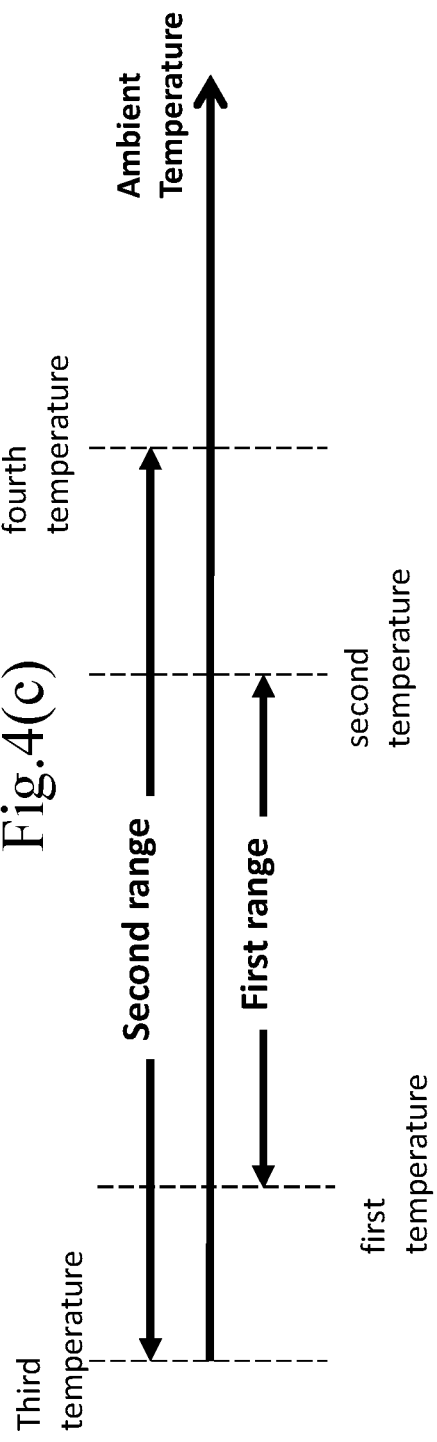

FIG. 3 is a diagram schematically illustrating an oscillating device according to a third embodiment of the invention. Referring to FIG. 3, an oscillating device 3 is arranged in an environment having an ambient temperature. The oscillating device 3 includes a heater 30, a frequency source 31, a voltage controlled oscillation circuit 32, and a temperature controlled circuit 33. The voltage controlled oscillation circuit 32 and the temperature controlled circuit 33 may be an IC. The frequency of the frequency source 31 is temperature-dependent on the ambient temperature. The voltage controlled oscillation circuit 32 is coupled to the frequency source 31. When the ambient temperature is in a first range between a first temperature and a second temperature higher than the first temperature, the voltage controlled oscillation circuit 32 drives the frequency source 31 to reduce the frequency variation of the frequency source 31 resulted from the variation of the ambient temperature. The temperature controlled circuit 33 is coupled to the heater 20 and the voltage controlled oscillation circuit 32. When the ambient temperature is in a second range between a third temperature and a fourth temperature higher than the third temperature, the temperature controlled circuit 33 drives the heater 30 to a target temperature to adjust the operating temperature of the frequency source 31. The temperature controlled circuit 33 can transmit temperature information to the voltage controlled oscillation circuit 32. The first temperature is higher than the third temperature. The target temperature has a correlation of a first-order polynomial, a high-order polynomial, or a set of a first-order and high-order polynomial combination to the ambient temperature. The temperature controlled circuit 33 may be configured to sense the ambient temperature to generate a first detected voltage D1 when the ambient temperature is in the first range. The voltage controlled oscillation circuit 32 receives the first detected voltage D1 and drives the frequency source 31 based on the first detected voltage D1.

In some embodiments of the present invention, the temperature controlled circuit 33 may include a temperature sensor 331, a target temperature setting circuit 332, and a comparator 333. The temperature sensor 331 is configured to sense the ambient temperature. The temperature sensor 331 generates the first detected voltage D1 based on the ambient temperature when the ambient temperature is in the first range. The temperature sensor 331 generates a second detected voltage D2 based on the ambient temperature when the ambient temperature is in the second range. The target temperature setting circuit 332 is configured to sense the ambient temperature. The target temperature setting circuit 332 generates a control voltage C based on the ambient temperature and the target temperature when the ambient temperature is in the second range. The comparator 333 is coupled to the heater 30, the temperature sensor 331, and the target temperature setting circuit 332 and configured to receive the second detected voltage D2 and the control voltage C and drives the heater 30 to the target temperature based on the second detected voltage D2 and the control voltage C.

In some embodiments of the present invention, the voltage controlled oscillation circuit 32 may include a voltage generator 322 and at least one voltage controlled variable capacitor 323. The voltage generator 322 is coupled to the temperature sensor 331 and configured to receive the first detected voltage D1 and generate at least one operating voltage OV based on the first detected voltage D1. The voltage controlled variable capacitor 323 is coupled to the frequency source 31 and the voltage generator 322 and configured to receive the operating voltage OV to adjust capacitance, thereby reducing the frequency variation of the frequency source 31.

FIGS. 4(a)-4(d) are diagrams schematically illustrating the distribution of a first temperature, a second temperature, a third temperature, and a fourth temperature according to the first embodiment, the second embodiment, and the third embodiment of the present invention.

Figure 5:
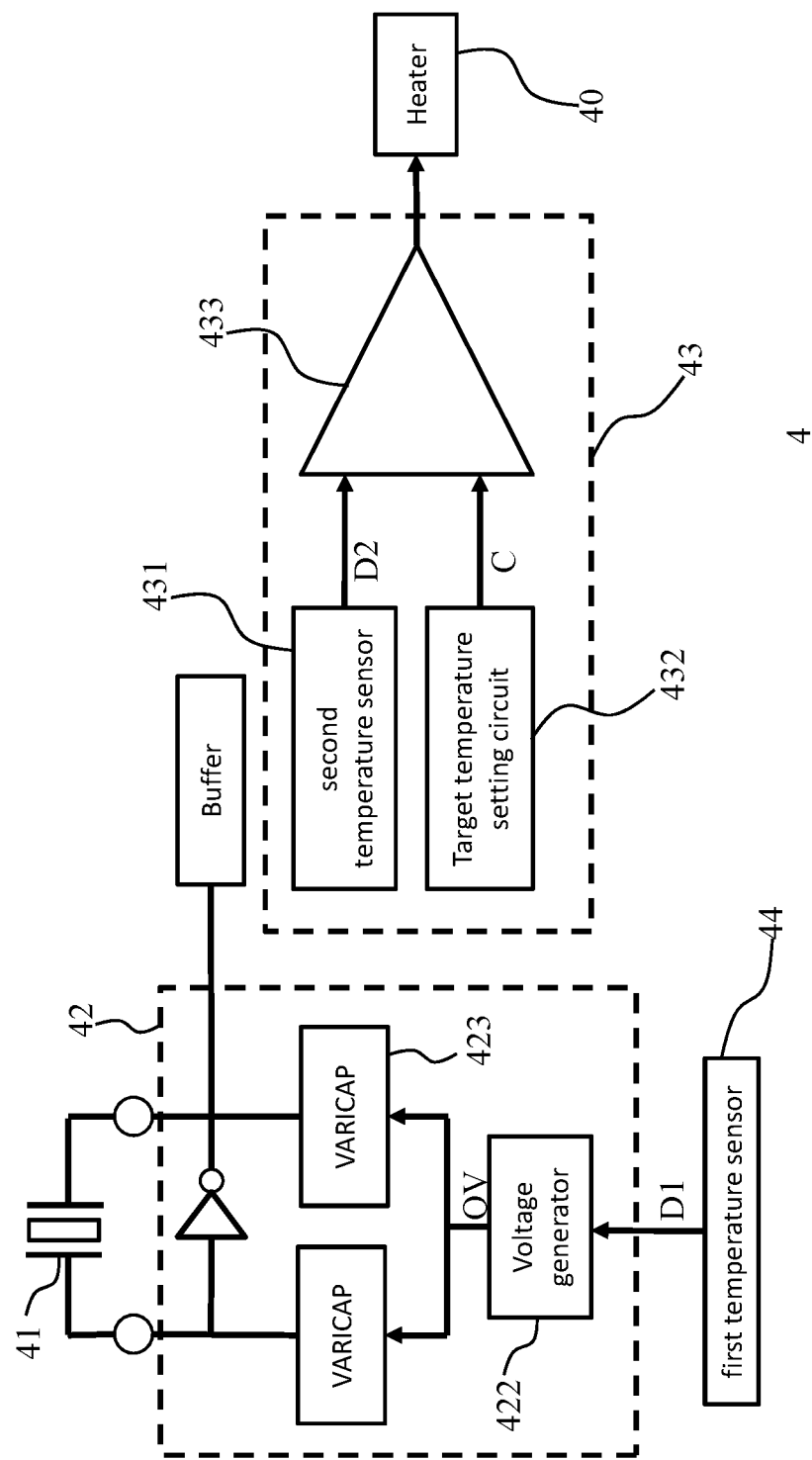
FIG. 5 is a diagram schematically illustrating an oscillating device according to a fourth embodiment of the invention.
Figure 6A:
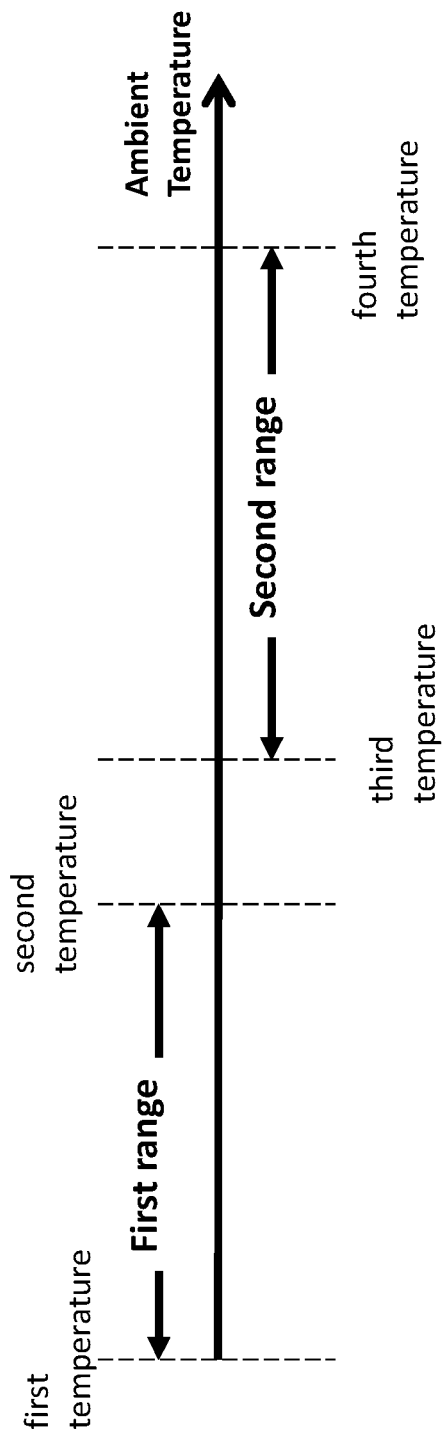
FIGS. 6(a)-6(d) are diagrams schematically illustrating the distribution of a first temperature, a second temperature, a third temperature, and a fourth temperature according to the fourth embodiment of the present invention.
Figure 6B:
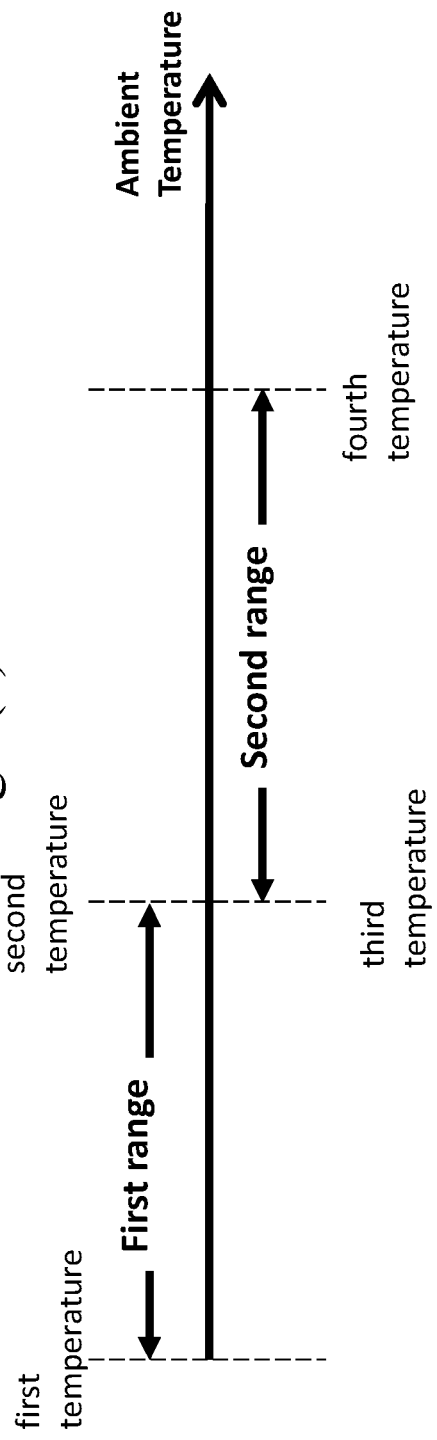
Figure 6C:
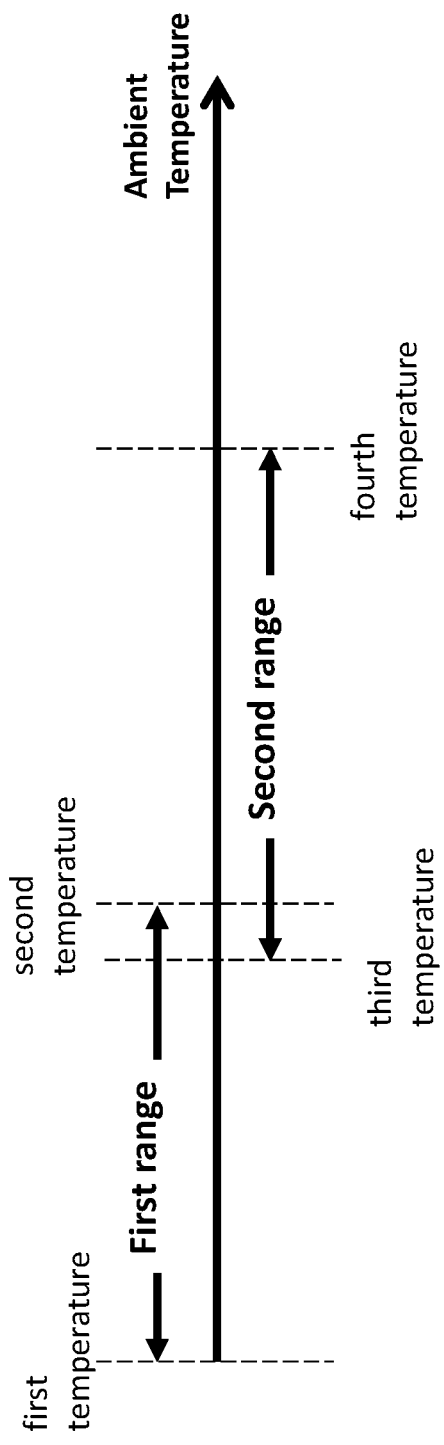
Figure 6D:
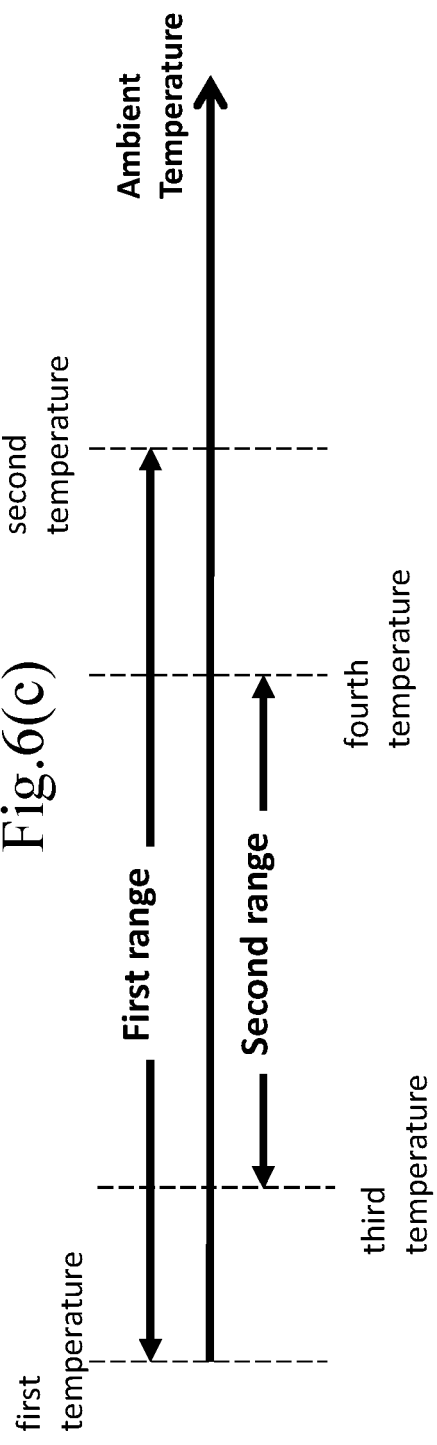

FIG. 5 is a diagram schematically illustrating an oscillating device according to a fourth embodiment of the invention. FIGS. 6(a)-6(d) are diagrams schematically illustrating the distribution of a first temperature, a second temperature, a third temperature, and a fourth temperature according to the fourth embodiment of the present invention. Referring to FIG. 5 and FIGS. 6(a)-6(d), an oscillating device 4, arranged in an environment having an ambient temperature, includes a heater 40, a frequency source 41, a voltage controlled oscillation circuit 42, a temperature controlled circuit 43, and a first temperature sensor 44. Each of the voltage controlled oscillation circuit 42 and the temperature controlled circuit 43 may be an IC. The temperature controlled circuit 43 is coupled to the heater 40. The frequency of the frequency source 41 is temperature-dependent on the ambient temperature. When the ambient temperature is in a first range between a first temperature and a second temperature higher than the first temperature, the temperature controlled circuit 43 drives the heater 40 to a target temperature to adjust the operating temperature of the frequency source 41. The first temperature sensor 44 is configured to sense the ambient temperature. The first temperature sensor 44 generates a first detected voltage D1 based on the ambient temperature when the ambient temperature is in a second range between a third temperature and a fourth temperature higher than the third temperature. The voltage controlled oscillation circuit 42 is coupled to the frequency source 41 and the first temperature sensor 44. The voltage controlled oscillation circuit 42 receive the first detected voltage D1 to drive the frequency source 41 and reduce the frequency variation of the frequency source 41 resulted from the variation of the ambient temperature. The third temperature is higher than the first temperature. The target temperature has a correlation of a first-order polynomial, a high-order polynomial, or a set of a first-order and high-order polynomial combination to the ambient temperature.

In some embodiments of the present invention, the temperature controlled circuit 43 may include a second temperature sensor 431, a target temperature setting circuit 432, and a comparator 433. The second temperature sensor 431 is configured to sense the ambient temperature. The second temperature sensor 431 generates a second detected voltage D2 based on the ambient temperature when the ambient temperature is in the first range. The target temperature setting circuit 432 is configured to sense the ambient temperature. The target temperature setting circuit 432 generates a control voltage C based on the ambient temperature and the target temperature when the ambient temperature is in the first range. The comparator 433 is coupled to the heater 40, the second temperature sensor 431, and the target temperature setting circuit 432 and configured to receive the second detected voltage D2 and the control voltage C and drives the heater 40 to the target temperature based on the second detected voltage D2 and the control voltage C.

In some embodiments of the present invention, the voltage controlled oscillation circuit 42 may include a voltage generator 422 and at least one voltage controlled variable capacitor 423. The voltage generator 422 is coupled to the first temperature sensor 44 and configured to receive the first detected voltage D1 and generate at least one operating voltage OV based on the first detected voltage D1. The voltage controlled variable capacitor 423 is coupled to the frequency source 41 and the voltage generator 422 and configured to receive the operating voltage OV to adjust capacitance, thereby reducing the frequency variation of the frequency source 41.

According to the embodiments provided above, the oscillating device avoids degrading the performance of the IC due to too high a target temperature.

What is claimed is:

1. An oscillating device, arranged in an environment having an ambient temperature, comprising:
   a heater;
   a frequency source whose frequency is temperature-dependent on the ambient temperature;
   a voltage controlled oscillation circuit electrically connected to the frequency source, wherein, when the ambient temperature is in a first range between a first temperature and a second temperature higher than the first temperature, the voltage controlled oscillation circuit drives the frequency source to reduce a frequency variation of the frequency source resulted from a variation of the ambient temperature; and
   a temperature controlled circuit electrically connected to the heater and the voltage controlled oscillation circuit, wherein, when the ambient temperature is in a second range between a third temperature and a fourth temperature higher than the third temperature, the temperature controlled circuit drives the heater to a target temperature to adjust an operating temperature of the frequency source;
   wherein the first temperature is higher than the third temperature;
   wherein the second temperature is higher than the fourth temperature;
   wherein the temperature controlled circuit generates a first voltage and a second voltage based on the ambient temperature, transmits the first voltage to the voltage controlled oscillation circuit to drive the frequency source, and drives the heater in response to the second voltage.

2. The oscillating device according to claim 1, further comprising a first temperature sensor coupled to the voltage controlled oscillation circuit, wherein the first temperature sensor is configured to sense the ambient temperature to generate a first detected voltage when the ambient temperature is in the first range, the temperature controlled circuit generates a first control voltage as the first voltage based on the ambient temperature and the target temperature when the ambient temperature is in the first range, and the voltage controlled oscillation circuit receives the first control voltage and the first detected voltage and drives the frequency source based on the first control voltage and the first detected voltage.

3. The oscillating device according to claim 2, wherein the temperature controlled circuit comprises:
 a second temperature sensor configured to sense the ambient temperature, wherein the second temperature sensor generates a second detected voltage based on the ambient temperature when the ambient temperature is in the second range;
 a target temperature setting circuit configured to sense the ambient temperature, wherein the target temperature setting circuit generates a second control voltage as the second voltage based on the ambient temperature and the target temperature when the ambient temperature is in the second range, and the target temperature setting circuit generates the first control voltage based on the ambient temperature and the target temperature when the ambient temperature is in the first range; and
 a heating comparator coupled to the heater, the second temperature sensor, and the target temperature setting circuit and configured to receive the second detected voltage and the second control voltage and drive the heater to the target temperature based on the second detected voltage and the second control voltage.

4. The oscillating device according to claim 2, wherein the voltage controlled oscillation circuit comprises:
 a driving comparator coupled to the first temperature sensor and the target temperature setting circuit, the driving comparator receives the first control voltage and the first detected voltage to generate a driving voltage;
 a voltage generator coupled to the driving comparator and configured to receive the driving voltage and generate at least one operating voltage based on the driving voltage; and
 at least one voltage controlled variable capacitor coupled to the frequency source and the voltage generator and configured to receive the at least one operating voltage to adjust capacitance, thereby reducing the frequency variation of the frequency source.

5. The oscillating device according to claim 1, wherein the temperature controlled circuit is configured to sense the ambient temperature to generate a first detected voltage when the ambient temperature is in the first range, the temperature controlled circuit generates a first control voltage as the first voltage based on the ambient temperature and the target temperature when the ambient temperature is in the first range, and the voltage controlled oscillation circuit receives the first control voltage and the first detected voltage and drives the frequency source based on the first control voltage and the first detected voltage.

6. The oscillating device according to claim 5, wherein the temperature controlled circuit comprises:
 a temperature sensor configured to sense the ambient temperature, wherein the temperature sensor generates the first detected voltage based on the ambient temperature when the ambient temperature is in the first range, and the temperature sensor generates a second detected voltage based on the ambient temperature when the ambient temperature is in the second range;
 a target temperature setting circuit configured to sense the ambient temperature, wherein the target temperature setting circuit generates the first control voltage based on the ambient temperature and the target temperature when the ambient temperature is in the first range, and the target temperature setting circuit generates a second control voltage as the second voltage based on the ambient temperature and the target temperature when the ambient temperature is in the second range; and
 a heating comparator coupled to the heater, the temperature sensor, and the target temperature setting circuit and configured to receive the second detected voltage and the second control voltage and drive the heater to the target temperature based on the second detected voltage and the second control voltage.

7. The oscillating device according to claim 5, wherein the voltage controlled oscillation circuit comprises:
 a driving comparator coupled to the temperature sensor and the target temperature setting circuit and configured to receive the first control voltage and the first detected voltage to generate a driving voltage;
 a voltage generator coupled to the driving comparator and configured to receive the driving voltage and generate at least one operating voltage based on the driving voltage; and
 at least one voltage controlled variable capacitor coupled to the frequency source and the voltage generator and configured to receive the at least one operating voltage to adjust capacitance, thereby reducing the frequency variation of the frequency source.

8. The oscillating device according to claim 1, wherein the temperature controlled circuit is configured to sense the ambient temperature to generate a first detected voltage as the first voltage when the ambient temperature is in the first range, and the voltage controlled oscillation circuit receives the first detected voltage and drives the frequency source based on the first detected voltage.

9. The oscillating device according to claim 8, wherein the temperature controlled circuit comprises:
 a temperature sensor configured to sense the ambient temperature, wherein the temperature sensor generates the first detected voltage based on the ambient temperature when the ambient temperature is in the first range, and the temperature sensor generates a second detected voltage as the second voltage based on the ambient temperature when the ambient temperature is in the second range;
 a target temperature setting circuit configured to sense the ambient temperature, wherein the target temperature setting circuit generates a control voltage based on the ambient temperature and the target temperature when the ambient temperature is in the second range; and
 a comparator coupled to the heater, the temperature sensor, and the target temperature setting circuit and configured to receive the second detected voltage and the control voltage and drives the heater to the target temperature based on the second detected voltage and the control voltage.

10. The oscillating device according to claim 8, wherein the voltage controlled oscillation circuit comprises:

a voltage generator coupled to the temperature sensor and configured to receive the first detected voltage and generate at least one operating voltage based on the first detected voltage; and at least one voltage controlled variable capacitor coupled to the frequency source and the voltage generator and configured to receive the at least one operating voltage to adjust capacitance, thereby reducing the frequency variation of the frequency source.

11. The oscillating device according to claim 1, wherein the target temperature has a correlation of a first-order polynomial, a high-order polynomial, or a set of a first-order and high-order polynomial combination to the ambient temperature.

* * * * *